(12) United States Patent
Tews et al.

(10) Patent No.: US 6,544,855 B1
(45) Date of Patent: Apr. 8, 2003

(54) PROCESS FLOW FOR SACRIFICIAL COLLAR WITH POLYSILICON VOID

(75) Inventors: Helmut Horst Tews, Unterhaching (DE); Rolf Weis, Wappinger Falls, NY (US); Irene Lennox McStay, Hopewell Junction, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/041,779

(22) Filed: Oct. 19, 2001

(51) Int. Cl.[7] ............................................... H01L 21/20
(52) U.S. Cl. ....................................... 438/386; 438/243
(58) Field of Search .............................. 438/239, 242, 438/243, 246, 253, 386, 389, 561, 954, 637, 672, 675, 680

(56) References Cited

U.S. PATENT DOCUMENTS

| | | | |
|---|---|---|---|
| 4,984,039 A | * 1/1991 | Douglas | ..................... 357/236 |
| 5,618,751 A | * 4/1997 | Golden et al. | ............... 438/392 |
| 6,008,103 A | * 12/1999 | Hoepfner | ..................... 438/386 |
| 6,008,104 A | 12/1999 | Schrems | |
| 6,107,133 A | * 8/2000 | Furukawa et al. | ........... 438/239 |
| 6,150,670 A | 11/2000 | Faltermeier et al. | |
| 6,261,972 B1 | 7/2001 | Tews et al. | |

* cited by examiner

*Primary Examiner*—David Nelms
*Assistant Examiner*—David Nhu
(74) *Attorney, Agent, or Firm*—Slater & Matsil, L.L.P.

(57) ABSTRACT

A process for forming a sacrificial collar on the top portion of a deep trench (114) of a semiconductor wafer (100). A nitride layer (116) is deposited within the trenches (114). A semiconductor material layer (120) is deposited over the nitride layer (116) and is etched back to a predetermined height (A) below the substrate 112 top surface. A semiconductor material plug (132) is formed at the top surface of the recessed semiconductor material layer (120), leaving a void (133) in the bottom of each trench (114). An oxide layer (134) and nitride layer (136) are formed over the wafer (100) and trenches (116), and the semiconductor material plug (132) and semiconductor material layer (120) are removed from the bottom of the trenches (116).

21 Claims, 5 Drawing Sheets

US 6,544,855 B1

PROCESS FLOW FOR SACRIFICIAL COLLAR WITH POLYSILICON VOID

CROSS-REFERENCE TO RELATED APPLICATIONS

This application is related to commonly-assigned U.S. patent application Ser. No. 09/939,554 filed on Aug. 28, 2001 by Tews, et. al, entitled "Process Flow for Two-Step Collar In DRAM Preparation," which is incorporated herein by reference.

TECHNICAL FIELD

The present invention relates generally to the fabrication of semiconductor integrated circuits (IC's), and more particularly to the fabrication of memory IC's.

BACKGROUND

Semiconductor devices are used in a variety of electronic applications, such as personal computers and cellular phones, for example. The semiconductor industry in general is being driven to decrease the size of semiconductor devices located on integrated circuits. Miniaturization is generally needed to accommodate the increasing density of circuits necessary for today's semiconductor products.

One semiconductor product widely used in electronic systems for storing data is a semiconductor memory device, and a common type of semiconductor memory device is a dynamic random access memory (DRAM). A DRAM typically includes millions or billions of individual DRAM cells arranged in an array, with each cell storing one bit of data. A DRAM memory cell typically includes an access field effect transistor (FET) and a storage capacitor. The access FET allows the transfer of data charges to and from the storage capacitor during reading and writing operations. In addition, the data charges on the storage capacitor are periodically refreshed during a refresh operation.

More recent DRAM designs involve manufacturing storage capacitors that comprise deep trenches and an overlying transistor disposed over the deep trench storage cells formed in a subsequent layer. This type of DRAM structure is referred to as a vertical DRAM.

An interim structure often used in the formation of deep trench storage cells is a sacrificial collar. A sacrificial collar comprises a thin insulating collar layer formed at the top of DRAM trench that is left remaining during trench processing, for example, during bottle etch and doping of the semiconductor substrate within the deep trench. The sacrificial collar is removed prior to the completion of the semiconductor memory device, and is replaced by a permanent collar after the deep trench processing is completed.

Formation of sacrificial collars results in the ability to easily perform processing steps in the trench before a thick oxide layer or permanent collar around the top part of a trench is formed. The permanent thick collar is required to electrically isolate memory cells from one another, and serves to reduce parasitic vertical transistor action in the finished device.

With the trend towards decreasing the size of semiconductor components, manufacturing sacrificial collars in deep trenches having high aspect ratios proves challenging.

SUMMARY OF THE INVENTION

Embodiments of the present invention achieve technical advantages as a process flow for a sacrificial collar scheme for a trench in a semiconductor device, such as a DRAM. The process flow presented here ensures that there is a void in the sacrificial semiconductor material deposited in each trench of a wafer when the sacrificial collar is formed, making it easier to remove. the sacrificial semiconductor material. A semiconductor material layer is deposited on the sidewalls of the trenches, and a semiconductor material plug is formed at the top of the semiconductor material layer to leave a void in the bottom of the trenches.

In one embodiment, disclosed is a method of manufacturing a semiconductor device, comprising providing a semiconductor substrate, and forming a plurality of trenches in the substrate. The method includes forming at least a first insulating layer over the substrate along the trench sidewalls, and forming a semiconductor material layer over the first insulating layer along the trench sidewalls. The method includes recessing the semiconductor material layer to a predetermined height below the substrate top surface, forming a semiconductor material plug at the top surface of the recessed semiconductor material layer, leaving a void in the bottom of each trench, and depositing a second insulating layer over the first insulating layer and over the semiconductor material layer and plug within the trenches. The second insulating layer is removed from the top surface of the substrate and the horizontal top surface of the semiconductor material plug, leaving portions of the second insulating layer at the sidewall in the top area of the trenches. The semiconductor material plug is removed, and the semiconductor material layer is removed from within the trenches.

In another embodiment, disclosed is a method of forming a sacrificial collar in a semiconductor device having a plurality of trenches formed in a substrate, the trenches having sidewalls, the method comprising forming a first nitride layer on the trench sidewalls, and forming a semiconductor material layer over the first nitride layer at least along the trench sidewalls. The method includes recessing the semiconductor material layer to a predetermined depth below the substrate surface, forming a semiconductor material plug at the top surface of the recessed semiconductor material layer, leaving a void in the bottom of each trench, and depositing a first oxide layer over the first nitride layer, the recessed semiconductor material layer and semiconductor material plug. The method includes depositing a second nitride layer over the first oxide layer, and removing the first oxide layer and second nitride layer from the top surface of the substrate and the top surface of the semiconductor material plug, leaving portions of the first oxide layer and second nitride layer at the top of the trenches along the sidewalls. The semiconductor material plug and the semiconductor material layer are removed from within the trenches.

Advantages of embodiments of the invention include providing a thin semiconductor material layer that is easy to remove from a trench of a semiconductor wafer. A shorter etch process may be used to remove the semiconductor material layer than prior art etch processes that were required to remove semiconductor material from the entire trench. Over-etching of the wafer is prevented, with the use of the shorter etch process required to remove the semiconductor material layer. Furthermore, the recess depth of the collar is more precisely controllable than in prior art processes.

BRIEF DESCRIPTION OF THE DRAWINGS

The above features of embodiments of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

Figure 1:
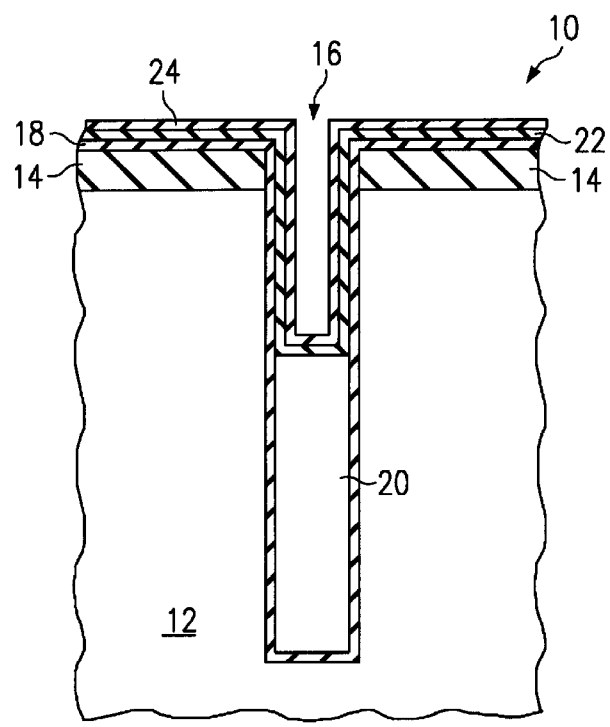
FIGS. 1 and 2 illustrate cross-sectional views of a less preferred sacrificial collar manufacturing process flow.

A less preferred process flow for forming sacrificial collars will be discussed, followed by a description of some exemplary embodiments of the present invention and a discussion of some advantages thereof. While a cross-section of one memory cell is shown in most of the figures, many other memory cells and components of memory cells may be present in the semiconductor devices shown.

A less preferred method of forming a sacrificial collar, disclosed in U.S. patent application Ser. No. 09/939,554, incorporated herein by reference, will first be described, with reference to FIG. 1. After a pad nitride 14 is deposited on a substrate 12 of a wafer 10, a deep trench etch is performed to form deep trenches 16. The trenches 16 may be 10 $\mu$m deep and have a top diameter, typically oval-shaped, of 100 nm wide, although as feature sizes of semiconductor devices are decreasing, these dimensions are decreasing. A thin nitride liner 18 is deposited on the trench 16 sidewalls, e.g. SiN deposited by chemical vapor deposition (CVD).

The trenches 16 are filled with sacrificial polysilicon 20. This polysilicon 20 is referred to as "sacrificial" because it will not remain in place in the finished product. The term "polysilicon" is used herein to refer to both amorphous and polycrystalline silicon. After the trench fill, the sacrificial polysilicon 20 is etched or recessed to a predetermined depth, e.g., approximately 1.5 $\mu$m, below the wafer surface or bottom of the pad nitride 14, respectively. The etch step defines the bottom position of the desired collar and, at the same time, the top position of buried plate doping and bottle etch.

After recessing the sacrificial polysilicon, a thin oxide layer 22 is formed or deposited that functions as an etch stop for the bottom nitride 18 strip process. Oxide layer 22 is formed over the recessed polysilicon 20 and nitride liner 18. A thin top nitride layer 24, which will function as an etch stop for sacrificial polysilicon 20 strip process, is formed over the oxide layer 22.

Figure 2:
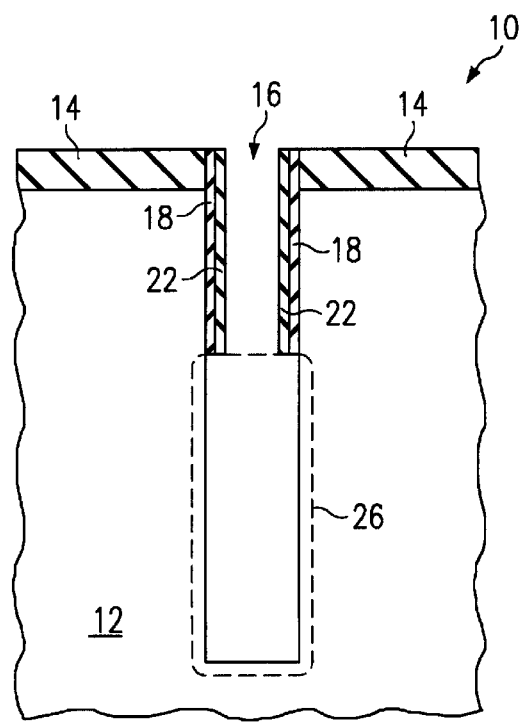

Shown in FIG. 2, the wafer 10 is exposed to a reactive ion etch (RIE) open process, e.g., using an anisotropic RIE process, opening only the horizontal part of the layers, exposing the sacrificial polysilicon 20 in the trenches 16, and leaving nitride layer 24 and oxide layer 22 on the sidewalls of the trenches 16.

The sacrificial polysilicon 20 is stripped, with a wet chemical strip, for example. The nitride layer 24 on the sidewalls protects the oxide layer 22 during the strip process. A nitride etch is used to remove the nitride layer 18 from the bottom of the trenches 16 and the nitride layer 24 from the collar area along the trench 16 sidewalls. The bare silicon walls of the substrate 12 are now exposed in the bottom of the trench 16.

Using the sacrificial collar remaining at the top of the trenches 16 created by oxide 24 and nitride 18, the bottom of the trenches 16 may then be processed further, for example, a silicon etch bottle process, shown at 26, may be used to widen the trench 16. A gas-phase doping may then be performed, e.g., injecting arsine gas at high temperatures, diffusing the arsenic into the silicon sidewalls, forming a highly-doped region which will function as the outer electrode of a DRAM capacitor, for example.

The wafer 10 may then be processed further according to standard processing procedures to complete the manufacturing of the semiconductor wafer, e.g., depositing the capacitor dielectric, which may comprise a nitride, the trench may be filled with highly-doped polysilicon to form the inner electrode, and the upper layer processing may be completed, for example, including depositing the final thick collar, and constructing a vertical transistor in the top part of the trench 16 which acts as the array transistor that switches charge into and out of the trench 16.

Figure 3:
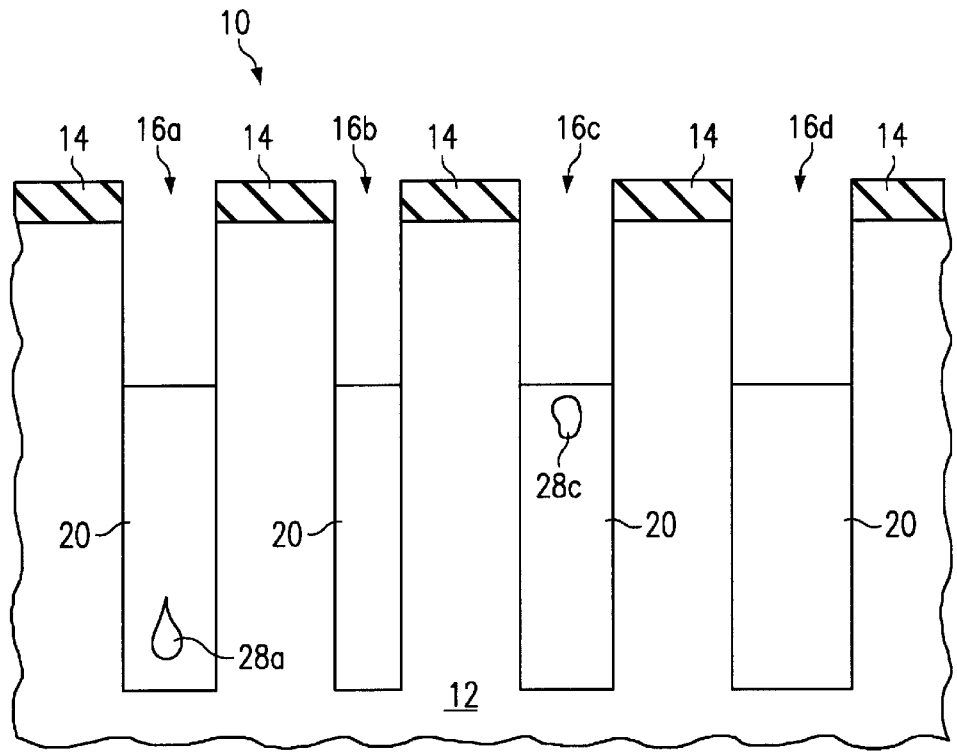
FIG. 3 shows a cross-sectional view of problems with the less preferred sacrificial collar process flows shown in FIGS. 1 and 2.

A problem with the process described for FIGS. 1 and 2 is that filling a deep trench with polysilicon is a complex procedure prone to problems. The deposition of the polysilicon is usually not uniform, resulting in points where the trenches close, in the deposition process. Depending on the shape of the trenches 16 and on the polysilicon deposition process, narrow voids sometimes form inside the trenches 16 within the polysilicon 20 after the sacrificial polysilicon 20 fill process, as shown in FIG. 3.

When a void 28 is present, only a weak etch is required for the sacrificial polysilicon 20 strip process. However, the void 28 formation is very sensitive to the shape of the trench, e.g. the taper angle of the sidewalls, as well as to the detailed process parameters of the polysilicon fill process. It is a statistical phenomenon that is unpredictable and uncontrollable in deep trenches, and voids 28 do not exist in all trenches. Voids 28 may occur anywhere within the trench 16, e.g., near the bottom, as shown at 28a, near the top as shown at 28c, or near the center of the trench 16 (not shown). The voids 28 may comprise a variety of sizes, shapes and positions. Uncontrolled void 28 formation is detrimental because it increases the time required to remove the polysilicon 20 from the trenches, introducing uncertainties in the process flow.

Another problem is that trench 16 formation is imperfect. The diameter of the trenches 16 typically varies over a single wafer due to radial dependences of the lithographic masking process, the mask open etch process of hard masks, and radial dependences of the trench dry etch. For example, trenches 16a and 16c have substantially the same diameter, while trench 16b has a smaller diameter than average and trench 16d has a wider diameter than average, for trenches 16 on the wafer 10. This is disadvantageous because during the etch-back of the polysilicon 20, more polysilicon 20 will be removed in trench 16d, and less polysilicon 20 will be removed in trench 16b. Thus, the collars of the trenches formed later will have different heights for the memory array.

Another problem is that the temperature varies slightly during polysilicon deposition, resulting in varying deposition rates from the center to the edge of the wafer. The higher the temperature, the more polycrystalline and less conformal the polysilicon 20 becomes. Therefore, over a single wafer 10 surface, the conformality of the deposition changes. At a very low deposition rate and low temperature, the deposition rate is very conformal, but increasing the temperature by 10 degrees, the chance of having a void formation is much greater. Therefore, the chance of having a void 28 or not having a void varies across the surface of a wafer 10.

The polysilicon 20 is difficult to remove within the deep trenches 16. To remove the polysilicon 20, it has to be assumed that no void is present in the polysilicon. Therefore a very lengthy etch procedure with high concentrations of etchant chemicals is required. Special precautions have to be made to assure that the nitride layers 18 and 24 are free from pinholes. Also, it has to be avoided that a highly concentrated etch may damage the wafer substrate on the edges of the wafer 10, which often is referred to in the art as black silicon or under-etching. Black silicon is very damaging in a wafer 10 fabrication process, because particulates are created that damage wafers 10 and leave particulates in the wafer processing equipment, which can subsequently cause damage to other wafers processed in the equipment. The sacrificial polysilicon etch process is required to etch a significant amount of silicon equal to the trench depth, e.g., 7–8 μm. Furthermore, it is very difficult to remove all of the polysilicon 20 from the bottom of the trenches 16.

Embodiments of the present invention ensure the formation of a void, making the amount of polysilicon within the trenches predictable, improving the process flow, reducing the etch time, and resulting in collars of substantially the same height across the entire wafer. A thin layer of semiconductor material is deposited on the sidewalls of the trenches, making the formation of voids predictable and reducing the etch time to remove the semiconductor material.

Embodiments of the present invention provide technical advantages as a process flow for forming a sacrificial collar in a deep trench of a memory cell. FIGS. 4–9 show cross-sectional views of a wafer 100 in various stages of manufacturing in accordance with an embodiment of the present invention.

Figure 4:
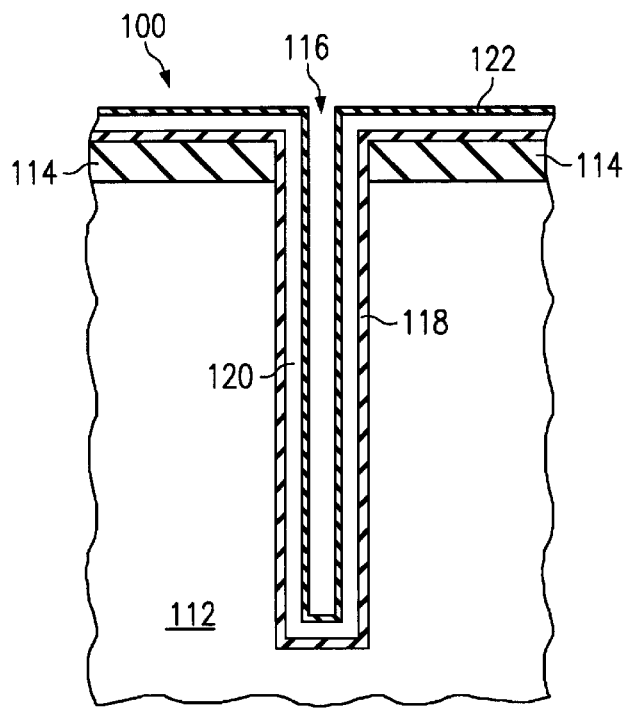
FIGS. 4 through 8 illustrate cross-sectional views of a semiconductor device at various stages of fabrication in accordance with an embodiment of the present invention, a process flow for forming a sacrificial collar using a semiconductor material layer and semiconductor material plug.
Figure 5:
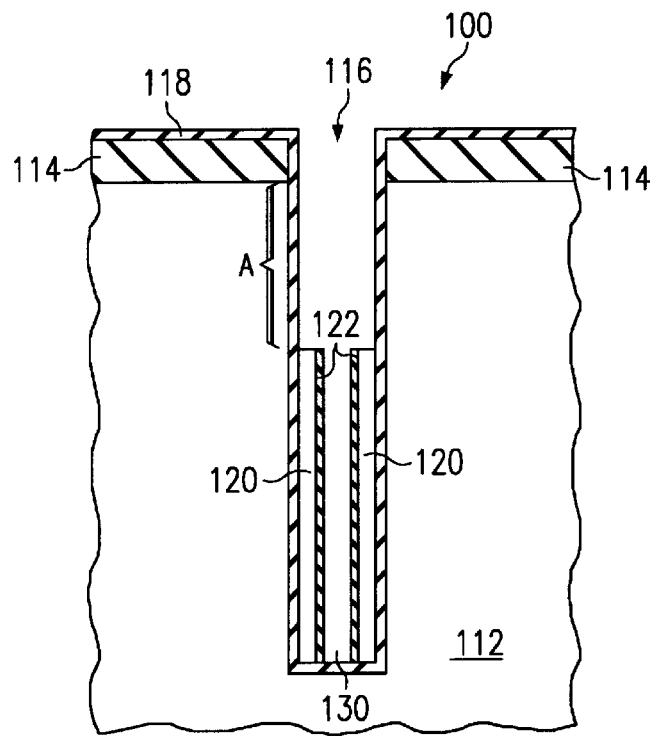

Shown in FIG. 4, a wafer 100 is provided having a substrate 112. The substrate 112 typically comprises a semiconductor material such as single-crystal silicon, and may include other conductive layers or other semiconductor elements such as transistors or diodes, as examples. The substrate 112 may alternatively comprise compound semiconductors such as GaAs, InP, Si/Ge, SiC, as examples.

A pad nitride 114 is deposited over the substrate 112. The pad nitride 114 may comprise silicon nitride deposited in a thickness of about 100 to 300 nm, for example, and alternatively, pad nitride 114 may comprise other nitrides. An optional oxide layer (not shown) comprising about 50 Å of $SiO_2$, for example, may be deposited on the substrate 112 prior to the deposition of the pad nitride 114 to reduce thermal stress effects.

The wafer 100 is patterned using conventional lithography techniques and etched to form deep trenches 116 in the substrate 112 and pad nitride 114. The deep trenches 116 may be about 10 μm deep and 100 nm in diameter wide, as examples, although these parameters are a function of the ground rules for the particular device being manufactured.

A first nitride layer 118 is deposited over the pad nitride 112 and substrate 112. First nitride layer 118 preferably comprises about 40 to 80 Å of silicon nitride or $Si_3N_4$ deposited by low pressure CVD (LPCVD), for example. First nitride layer 118 may alternatively comprise other nitrides, for example.

A sacrificial semiconductor material layer 120 is deposited over the first nitride layer 118. The semiconductor material layer 120 may comprise, for example, polysilicon or amorphous silicon, preferably deposited in a thickness of 20 to 40 nm on the trench 116 sidewalls. The semiconductor material layer 120 may also comprise other semiconductor materials.

The semiconductor material layer 120 surface is oxidized to form a thin oxide layer 122. Thin oxide layer 122 may be formed by exposing the wafer 100 to a temperature of 600 to 800 degrees C. for a few minutes to form 5 to 20 Å of an oxide such as $SiO_2$, for example.

An oxide RIE open step at the wafer surface is performed which is preferably anisotropic, e.g., only the horizontal surfaces of the wafers are etched. The RIE etch preferably comprises a dry etch using chlorine or fluorine ions, as examples. In particular, preferably, the thin oxide layer 122 and semiconductor material layer 120 are removed from the top surface of the wafer 100 and, eventually, from the bottom of the trenches 116 at 130, shown in FIG. 5.

The semiconductor material 120 is recessed to a predetermined depth "A", e.g. 1500 nm below the substrate 112 top surface. See U.S. Pat. No. 6,008,104 which discloses a polysilicon fill and recess in a trench.

In the semiconductor material layer 120 recess step, the thin oxide layer 122 prevents the attack of the sacrificial semiconductor material layer 120 from the trench sidewalls by the media used for the semiconductor material layer 120 recess. This is important because the media used for the recess step may etch at least partially isotropically.

Figure 6:
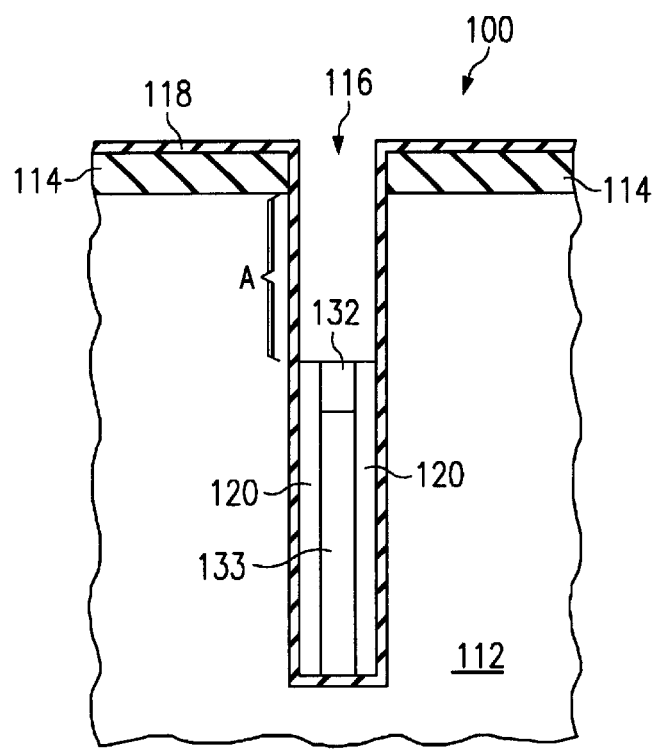

The thin oxide layer 122 is removed in an etch step, shown in FIG. 6.

Next, according to embodiments of the present invention, a semiconductor material layer divot fill step is performed to form a semiconductor material plug 132 at the top surface of the recessed semiconductor material layer, leaving a void 133 in each trench. The divot fill step may be performed using, preferably, around 50 nm, and more preferably, between 30 to 60 nm of a polysilicon deposition under conditions where the deposition is not very conformal, i.e., at relatively high deposition temperatures. The semiconductor material plug 132 may also comprise other semiconductor materials, for example.

Formation of the semiconductor material plug 132 in this controlled manner is advantageous because a void 133 will definitely be formed in each trench, decreasing the etch time required to remove semiconductor material layer 120 and making the etch process more predictable.

After the polysilicon deposition to form the plug 132, a wet chemical etch is performed to remove polysilicon from the top of the wafer 100, leaving the plug 132 in place.

Figure 7:
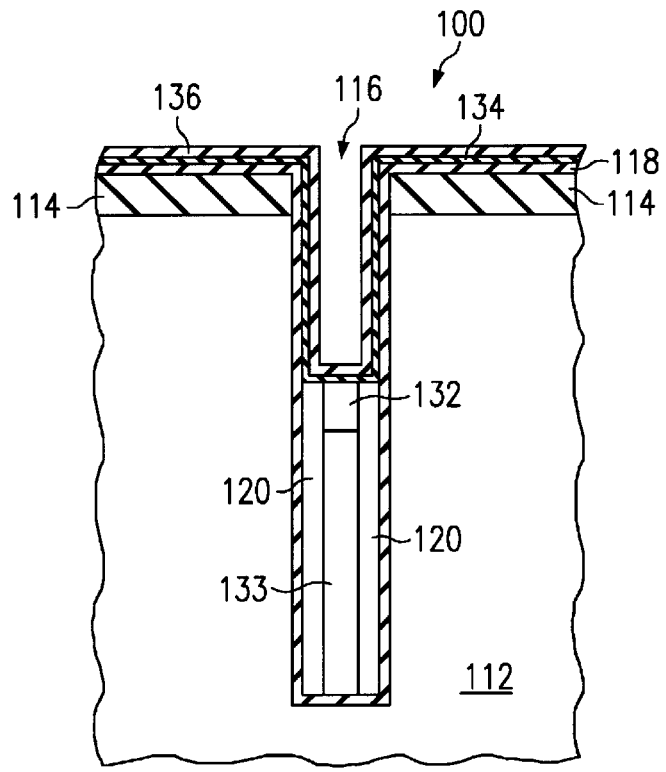

Shown in FIG. 7, an oxide layer 134 is formed over the nitride layer 118, the semiconductor material plug 132 and top portion of semiconductor material layer 120. The oxide layer 134 preferably comprises silicon dioxide, and may alternatively comprise other oxides, for example. Oxide layer 134 may be deposited by chemical vapor deposition (CVD), and alternatively, oxide layer 134 may be formed by oxidizing the top surface of the first nitride layer 118, semiconductor material 120, and plug 132, as examples. Preferably, the oxide layer 134 comprises a thickness of about 20 to 40 Å, for example.

A nitride layer 136 is formed over the oxide layer 134. The nitride layer 136 is preferably deposited in a thickness of about 30 to 80 Å, for example, and may comprise SiN or other nitrides.

Figure 8:
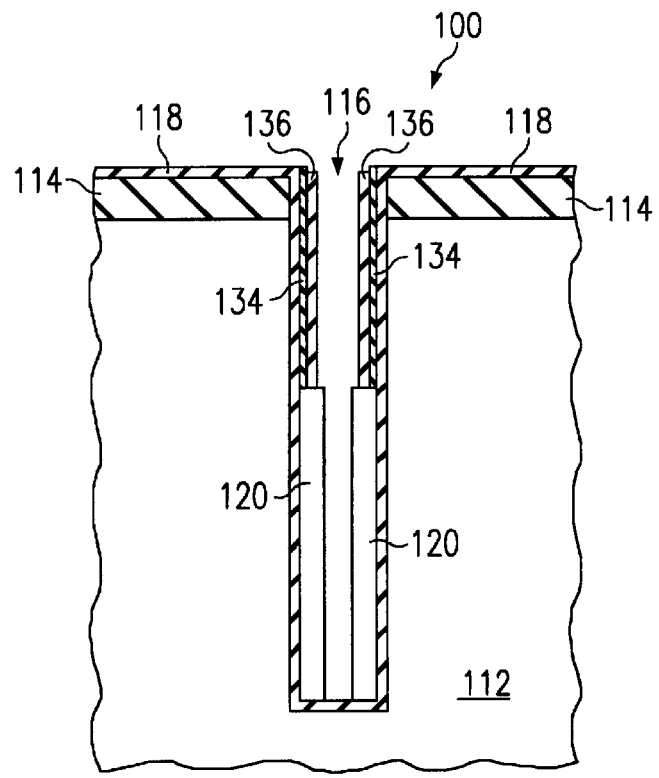

A RIE open step is performed, preferably comprising an anisotropic or vertical etch of the nitride layer 136 and the oxide layer 134, to remove the nitride layer 136 and oxide layer 134 from the top surface of the wafer 100 and the top of the semiconductor material 120 and plug 132, as shown in FIG. 8. The RIE etch preferably comprises a dry etch using chlorine or fluorine ions, as examples. Preferably, an overetch is performed to remove the semiconductor material plug 132 as part of the same RIE step. Removing the plug 132 to open the void 133 during the RIE open step makes the subsequent sacrificial semiconductor material strip or removal easier.

Alternatively, separate etch processes optimum for oxide, nitride and the plug semiconductor material may be used to remove the nitride layer 136, oxide layer, and semiconductor plug 132 in separate steps.

Figure 9:
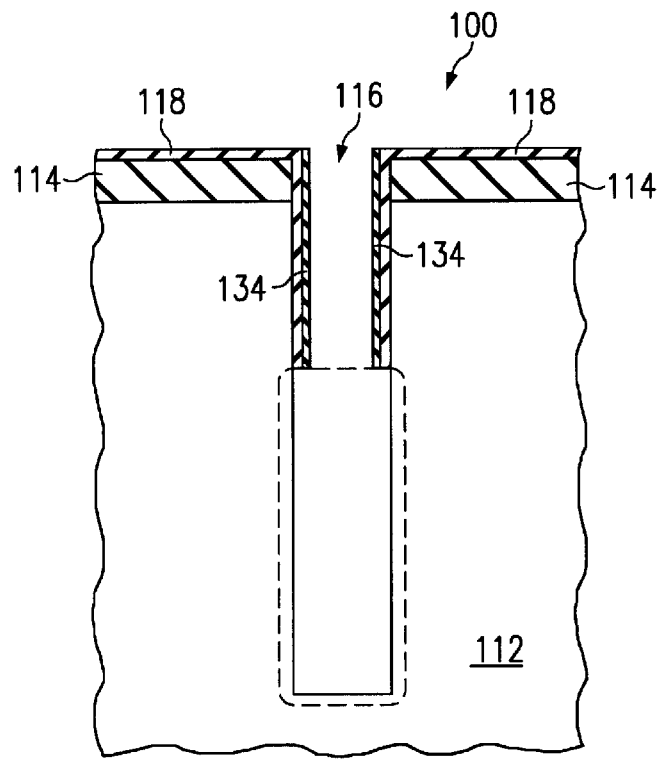
FIG. 9 illustrates a cross-sectional view of a wafer after the semiconductor material layer and semiconductor material plug are removed.

Next, the sacrificial semiconductor material 120 is removed from the trench 116 bottom, as shown in FIG. 9. Only a short etch process is required for the removal of the sacrificial semiconductor material 120, e.g. about 100 nm of silicon in case of sacrificial polysilicon.

A nitride etch is performed on the wafer 100 to remove the nitride 136 from the trench 116 sidewalls and from the bottom 118 of the trenches 116. The oxide layer 134 and nitride layer 118 remain at the top of the trenches 116 as a protective collar during subsequent bottle etching and gas-phase doping of the trench 116 bottom surface. Processing of the wafer 100 is then continued as in the prior art.

Control of polysilicon recess depth in DRAM trenches by using non-uniform polysilicon deposition may be improved in accordance with embodiments of the present invention. It has been observed in semiconductor device manufacturing that trenches 116 have varying diameter over the wafer 100 surface. Typically, trench 116 diameter is smaller at the wafer 100 center as compared to wafer 100 edge, which is referred to as critical dimension (CD) variation. The polysilicon recess depth depends on the CD: e.g., smaller trenches have a more shallow recess depth. It is difficult to deposit uniformly thick polysilicon from a wafer center to a wafer edge.

By the use of embodiments of the present invention, the polysilicon recess uniformity can be significantly improved by deposition of a thin polysilicon layer as compared to a complete trench fill by polysilicon as in prior art and less preferred methods.

Figure 10:
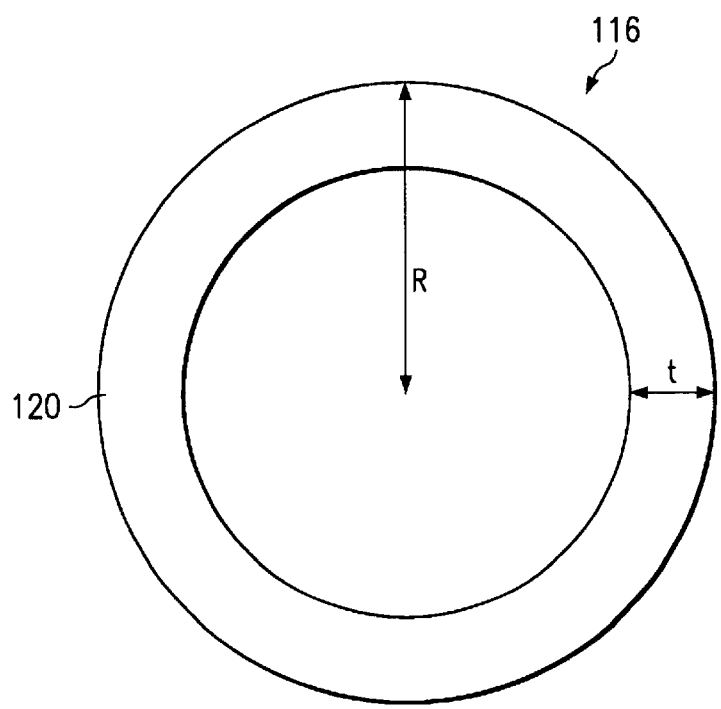
FIG. 10 shows a top view of a trench 116 in accordance with an embodiment of the present invention.

For illustration, FIG. 10 shows a top view of a trench 116. For simplicity, in the calculations presented herein, the trench 116 is shown as circular with radius "R", although preferably, the trench 116 is oval in shape. A semiconductor material, e.g., polysilicon layer of thickness "t" has been deposited on the trench sidewalls, as shown.

The area of the polysilicon layer in this top view is equal to:

$$A(R, t) = \pi R^2 - \pi (R-t)^2 \quad \text{Eq. 1:}$$

If the CD is larger at the wafer edges as compared to the wafer center, then:

$$A(R+\Delta R, t) = \pi (R+\Delta R)^2 - \pi (R+\Delta R - t)^2 \quad \text{Eq. 2:}$$

If the thickness of the polysilicon layer varies from center to edge as t+Δt, then:

$$A(R+\Delta R, t+\Delta t) = \pi (R+\Delta R)^2 - \pi (R+\Delta R - t - \Delta t)^2 \quad \text{Eq. 3:}$$

The polysilicon surface area is constant, if the polysilicon thickness variation over the wafer is chosen such that:

$$\Delta R = \Delta t. \quad \text{Eq. 4:}$$

The polysilicon recess depth depends on the CD of trench layouts; e.g., it is a function of the total amount of polysilicon required to be etched. In prior art processes, for larger completely filled trenches, there is more polysilicon to be etched, and for smaller completely filled trenches, there is less polysilicon to be etched. This will result in a variation in recess depth from center to edge on the wafer.

However, if the total amount of polysilicon required to be etched is constant by depositing a thin layer of polysilicon on the trench sidewalls in accordance with embodiments of the present invention, the polysilicon recess depth is independent from the CD variations.

Note that these calculations are true for systematic variations over the wafer surface. These variations usually represent the main part of the CD variations and are caused by the mask open process of the hard mask as well as on the etch process itself.

One goal in accordance with an embodiment of the present invention is to shape the radial polysilicon deposition uniformity such that the condition ΔR=Δt is fulfilled. The thickness variation of deposited polysilicon 120 depends to a large extent on the temperature uniformity of the wafer 100 during deposition. The thickness distribution can be changed by selecting the appropriate temperature center-to-edge of the wafer to achieve the same polysilicon recess depth everywhere on the wafer.

With respect to the polysilicon recess in trenches, embodiments of the invention allow for uniform recess depth independent of systematic center-to-edge CD variation.

While embodiments of the present invention are primarily described herein with reference to an embodiment manufacturing a DRAM, they also have useful application in ferroelectric random access memory (FRAM) devices and other semiconductor devices. For example, other semiconductor devices having topographies with trench-like, stack-like or via features may benefit from the manufacturing processes described herein. Embodiments of the present invention provide several advantages over prior art processes to form sacrificial collars of deep trenches of memory cells. The semiconductor material layer 120 comprises a thin layer that is easy to remove from the trench. A shorter etch process may be used to remove semiconductor material layer 120 than prior art etch processes that were required to remove semiconductor material from the entire trench. Overetching of the wafer 100 is prevented, with the use of the shorter etch required to remove the semiconductor material layer 120. Furthermore, the recess depth of the collar is more controllable than in prior art processes.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of embodiments of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of manufacturing a semiconductor device, comprising:

provide a semiconductor substrate, the substrate having a top surface;

forming a plurality of trenches in the substrate, the trenches having sidewalls;

forming at least a first insulating layer over the substrate along the trench sidewalls;

forming a semiconductor material layer over the first insulating layer along the trench sidewalls;

recessing the semiconductor material layer to a predetermined height below the substrate top surface;

forming a semiconductor material plug at the top surface of the recessed semiconductor material layer, leaving a void in the bottom of each trench beneath the semiconductor material plug;

depositing a second insulating layer over the first insulating layer and over the semiconductor material layer and plug within the trenches;

removing the second insulating layer from the top surface of the substrate and the top surface of the semiconductor material plug, leaving portions of the second insulating layer at the top of the trenches;

removing the semiconductor material plug; and removing the semiconductor material layer from within the trenches.

2. The method according to claim 1, wherein removing the semiconductor material layer from the top surface of the substrate and removing the second insulating layer comprise anisotropic etches.

3. The method according to claim 1, wherein the first insulating layer comprises a nitride and the second insulating layer comprises an oxide.

4. The method according to claim 1, wherein the semiconductor material layer and semiconductor material plug comprise amorphous or polycrystalline silicon.

5. The method according to claim 1, wherein the first insulating layer comprises SiN and the second insulating layer comprises SiO$_2$.

6. The method according to claim 1, further comprising:

depositing a third insulating layer over the second insulating layer, after depositing a second insulating layer; and removing the third insulating layer from the top surface of the substrate and the top surface of the semiconductor material plug, before removing the second insulating layer, leaving portions of the third insulating layer at the top of the trenches over the second insulating layer.

7. The method according to claim 6, wherein the third insulating layer comprises a nitride.

8. The method according to claim 7, wherein the third insulating layer comprises SiN.

9. The method according to claim 1, further comprising depositing a pad nitride, prior to forming the trenches.

10. The method according to claim 1, further comprising:

forming an oxide layer over the semiconductor material layer; and removing the oxide layer, before forming a semiconductor material plug.

11. The method according to claim 1, further comprising performing a bottle etch of the bottom of the trenches.

12. The method according to claim 11, further comprising doping the bottom of the trenches.

13. The method according to claim 1, wherein depositing a semiconductor material layer comprises depositing 50 to 200 Å of amorphous or polycrystalline silicon.

14. The method according to claim 1, wherein forming a semiconductor material plug comprises depositing 30–60 nm of amorphous or polycrystalline silicon under nonconformal conditions.

15. A method of forming a sacrificial collar in a semiconductor device having a plurality of trenches formed in a substrate, the trenches having sidewalls, the method comprising:

forming a first nitride layer on the trench sidewalls;

forming a semiconductor material layer over the first nitride layer at least along the trench sidewalls;

recessing the semiconductor material layer to a predetermined height below the substrate top surface;

forming a semiconductor material plug at the top surface of the recessed semiconductor material layer, leaving a void in the bottom of each trench;

depositing a first oxide layer over the first nitride layer, semiconductor material layer and semiconductor material plug;

depositing a second nitride layer over the first oxide layer;

removing the first oxide layer and second nitride layer from the top surface of the substrate and the top surface of the semiconductor material plug, leaving portions of the first oxide layer and second nitride layer at the top of the trenches along the sidewalls;

removing the semiconductor material plug; and removing the semiconductor material layer from within the trenches.

16. The method according to claim 15, further comprising:

forming an oxide layer over the semiconductor material layer, after forming a semiconductor material layer; and removing the oxide layer, before forming a semiconductor material plug.

17. The method according to claim 16, wherein removing the semiconductor material layer from the top surface of the substrate and removing the first oxide layer and second nitride layer from the top surface of the substrate comprise anisotropic etch processes.

18. The method according to claim 17, wherein depositing a semiconductor material layer comprises depositing 50 to 200 Å of amorphous or polycrystalline silicon.

19. The method according to claim 15, wherein the semiconductor material plug comprises amorphous or polycrystalline silicon.

20. The method according to claim 15, further comprising depositing a pad nitride, prior to forming the trenches.

21. The method according to claim 15, wherein forming a semiconductor material plug comprises depositing 30–60 nm of amorphous or polycrystalline silicon under nonconformal conditions.

* * * * *